United States Patent [19]

Iwata et al.

[11] Patent Number: 5,757,702
[45] Date of Patent: May 26, 1998

[54] DATA HOLDING CIRCUIT

[75] Inventors: Toru Iwata; Hironori Akamatsu; Hiroyuki Yamauchi, all of Osaka, Japan

[73] Assignee: Matsushita Electric Industrial Co., Ltd., Osaka, Japan

[21] Appl. No.: 739,363

[22] Filed: Oct. 29, 1996

[30] Foreign Application Priority Data

Oct. 31, 1995 [JP] Japan .................................... 7-283215

[51] Int. Cl.$^6$ .................................................. G11C 7/00
[52] U.S. Cl. .................. 365/189.05; 365/154; 365/156; 365/190
[58] Field of Search ....................... 365/154, 189.05, 365/156, 190

[56] References Cited

U.S. PATENT DOCUMENTS

| | | |
|---|---|---|
| 4,872,141 | 10/1989 | Plus et al. ................................ 365/154 |
| 5,040,146 | 8/1991 | Mattausch et al. ...................... 365/154 |
| 5,367,482 | 11/1994 | Guo et al. ................................ 365/154 |
| 5,438,538 | 8/1995 | Hashimoto ............................... 365/154 |

OTHER PUBLICATIONS

1995 Symposium on VLSI Circuits Digest of Technical Papers "Driving Source–Line (DSL) Cell Architecture for Sub–1–V High–Speed Low–Power Applications", Hiroyuki Mizuno and Takahiro Nagano, pp. 25–26.

*Primary Examiner*—Son T. Dinh
*Attorney, Agent, or Firm*—McDermott, Will & Emery

[57] ABSTRACT

A memory cell includes a first inverter and a second inverter connected with each other through the output node of one of the inverters and the input node of the other inverter, and first and second transistors. Each of the transistors connected with a word line at its gate electrode is interposed between one of a bit line pair and each memory node. This data holding circuit includes an element for increasing a memory cell supply potential for driving the pair of inverters to be higher than a supply potential applied to peripheral circuits, or an element for decreasing a ground voltage for driving the pair of inverters to be lower than a ground voltage applied to the peripheral circuits.

15 Claims, 6 Drawing Sheets

DATA HOLDING CIRCUIT

BACKGROUND OF THE INVENTION

The present invention relates to a data holding circuit, and more particularly it relates to a latch type data holding circuit such as a static random access memory (SRAM).

A semiconductor IC capable of a low voltage operation using a supply voltage of approximately 1 V has recently been desired in order to cope with portable electric equipment much in demand. It is a latch type data holding circuit such as an SRAM memory cell that is significant in the low voltage operation of a semiconductor IC.

For example, when an SRAM memory cell is operated at a low voltage, delay time occurring in activating a bit line after activating a word line is disadvantageously increased. A source line drive type memory cell for overcoming this problem is described in "1995 Symposium on VLSI Circuits Digest of Technical Papers".

On the basis of this report, a conventional data holding circuit will now be described with reference to FIG. 6.

FIG. 6 is a circuit diagram of a low-voltage driven SRAM memory cell exemplified as the conventional data holding circuit. In FIG. 6, a memory cell 51 is one of memory cells aligned in the form of an array, and includes load transistors 52 and 53 each composed of a PMOS transistor, drive transistors 54 and 55 each composed of an NMOS transistor, and access transistors 56 and 57.

When bit line pair BL and /BL for accessing one memory cell 51 among the memory cells aligned in a column direction of the array are activated, a supply potential VCC is applied to the bit line pair.

A word line WL for accessing one memory cell 51 among the memory cells aligned in a row direction of the array is connected with the gate electrodes of the access transistors 56 and 57.

A source line SL for driving the source electrodes of the drive transistors 54 and 55 is connected with a common source electrode shared by the drive transistors 54 and 55.

A first node N11 and a second node N12 have potentials reverse to each other, and the latching state of the first and second nodes N11 and N12 determine data to be held therein. For example, when the potential of the first node N11 is at a high level, the potential of the second node N12 is at a low level. Specifically, in the case where the first node N11 has a high potential and the second node N12 has a low potential, the gate electrodes of the load transistor 52 and the drive transistor 54 are both connected with the second node N12, and hence, the load transistor 52 is in an on-state and the drive transistor 54 is in an off-state. Furthermore, since the gate electrodes of the load transistor 53 and the drive transistor 55 are both connected with the first node N11, the load transistor 53 is in an off-state and the drive transistor 55 is in an on-state. Accordingly, in this case, the first node N11 keeps on holding a high data and the second node N12 keeps on holding a low data.

Assuming that the memory cell 51 is selected on the basis of an externally input address in a read operation, the word line WL connected with the memory cell 51 is supplied with a high potential, i.e., the supply potential VCC (of approximately 1 V), and the source line SL is supplied with a negative potential of approximately −0.5 V. As a result, the first node N11 is connected with the bit line BL, and the second node N12 is connected with the bit complementary line /BL. At this point, since the bit line pair BL and /BL have been precharged up to a high potential, that is, the supply potential VCC, there is no change in a portion including the first node N11 holding a high data, but in a portion including the second node N12, a current is extracted from the bit complementary line /BL to the source line SL through the access transistor 57 and the drive transistor 55. The extracted current is detected by a sense amplifier or the like as a difference in the current or the potential between the bit line pair BL and /BL, so as to be transferred to the outside as a data.

In a memory cell with a small supply potential VCC, there is generally a small difference between the supply potential VCC and the threshold voltage of a transistor, and hence, a drive current is also small. Accordingly, the transistor cannot be rapidly operated. In the low-voltage driven SRAM memory cell described in this report, however, the source line SL connected with the source electrode of the drive transistors 54 and 55 has a potential lower than a ground potential, and hence, the gate-source voltage of the drive transistor 55 is increased, resulting in improving the drive ability of the drive transistor 55. Thus, the drive transistor 55 can be operated at a high speed.

In this conventional low-voltage driven SRAM memory cell, a read current can be increased so as to increase the read rate. However, in the case where a negative voltage for driving the source line SL is generated by an internal negative voltage generator, it is difficult to efficiently generate the negative voltage under the condition of the low supply voltage of 1 V or less. Therefore, the power consumed by driving the source line is increased, resulting in a problem that the power consumption of the entire chip cannot be decreased.

Moreover, in a twin-well structure generally adopted at present, the well of an NMOS transistor cannot be separated from the well of another NMOS transistor, and hence, it is impossible to selectively control the potential of the well of each NMOS transistor. When a negative voltage is applied to the source line SL, a forward bias voltage is applied to the PN junction between the source and the well, and hence, the source potential cannot be lowered below −0.7 V. In consideration of a breakdown voltage of a noise and the like, the lower limit of the source potential is further increased. Accordingly, the gate-source voltage of a drive transistor cannot be sufficiently increased, resulting in a limit in increasing the operation speed.

SUMMARY OF THE INVENTION

The present invention was devised to overcome the aforementioned conventional problems, and the object is increasing the speed of a read or write operation and decreasing the power consumption while driving a data holding circuit at a low voltage.

In order to achieve this object, the drive ability of merely a transistor required of a rapid operation in the low voltage drive is improved in this invention, so as to attain both a rapid operation and small power consumption.

The data holding circuit of this invention comprises a data holding unit including a first inverter and a second inverter connected with each other through an output node of one of the first and second inverters and an input node of the other, and a supply potential applied to the data holding unit during a read period is set to be higher than a supply potential applied to peripheral circuits of the data holding unit.

In this data holding circuit, the supply potential applied to the data holding unit during a read period is set to be higher than the supply potential applied to the peripheral circuits of the data holding unit. Therefore, in the case where the first and second inverters include CMOSFETs, the gate-source voltage of an N-type drive transistor is increased in a read period, thereby increasing a read current. As a result, the low voltage drive can be realized and the read rate can be increased without increasing the area of a memory cell. Furthermore, when the read rate is set at an allowable value, the transistors included in the memory cell can be decreased in size as well as a current consumed in the circuit can be decreased.

In addition, also in a stand-by period, when the supply potential for driving the memory cell is set to be higher than the ordinary supply potential, the gate-source potential of the transistor through which a leakage current flows is 0 V. Therefore, the leakage current can be prevented from increasing, and the circuit is hardly affected by a noise such as a soft error, resulting in attaining a satisfactory data holding characteristic.

Alternatively, the data holding circuit of this invention comprises a data holding unit including a first inverter and a second inverter connected with each other through an output node of one of the first and second inverters and an input node of the other, and a supply potential applied to the data holding unit during a read period is set to be higher than a supply potential applied to the data holding unit during a write period.

In this data holding circuit, the supply potential applied to the data holding unit during a read period is set to be higher than the supply potential applied to the data holding unit during a write period. Therefore, in the case where the first and second inverters include CMOSFETs, the gate-source voltage of an N-type transistor is increased in a read period, thereby increasing a read current. As a result, the low voltage drive can be realized and the read rate can be increased without increasing the area of a memory cell. Furthermore, when the read rate is set at an allowable value, the transistors included in the memory cell can be decreased in size as well as a current consumed in the circuit can be decreased.

In addition, in a stand-by period, when the supply potential for driving the memory cell is set to be higher than the ordinary potential, the gate-source voltage of the transistor through which a leakage current flows is 0 V. Therefore, the leakage current can be prevented from increasing and the circuit is hardly affected by a noise such as a soft error, resulting in attaining a satisfactory data holding characteristic.

Alternatively, the data holding circuit of this invention comprises a data holding unit including a first inverter and a second inverter connected with each other through an output node of one of the first and second inverters and an input node of the other; and a sense line for reading a data from the data holding unit, and the sense line is precharged up to a low potential, and a ground potential applied to the data holding unit during a read period is set to be lower than a ground potential applied to peripheral circuits of the data holding unit.

In this data holding circuit, the sense line is precharged up to a low potential, and the ground potential applied to the data holding unit during a read period is set to be lower than the ground potential applied to the peripheral circuits of the data holding circuit. Therefore, in the case where the first and second inverters include CMOSFETs, the gate-source voltage of a P-type drive transistor is increased in a read period, thereby increasing a read current. As a result, the low voltage drive can be realized and the read rate can be increased without increasing the area of a memory cell.

In addition, since the precharge potential applied to the sense line is set at a low level, the sense line works as a source line, differently from the case where the sense line is precharged up to a high potential. Therefore, the read current can be further increased and the read rate can be further increased.

Furthermore, when the read rate is set at an allowable value, the transistors included in the memory cell can be decreased in size as well as a current consumed in the circuit can be decreased.

Alternatively, the data holding circuit of this invention comprises a data holding unit including a first inverter and a second inverter connected with each other through an output node of one of the first and second inverters and an input node of the other; and a sense line for reading a data from the data holding unit, and the sense line is precharged up to a low potential, and a ground potential applied to the data holding unit during a read period is set to be lower than a ground potential applied to the data holding unit during a write period.

In this data holding circuit, the sense line is precharged up to a low potential, and the ground potential applied to the data holding unit during a read period is set to be lower than the ground potential applied to the data holding unit during a write period. Therefore, in the case where the first and second inverters include CMOSFETs, the gate-source voltage of a P-type drive transistor is increased in a read period, thereby increasing a read current. As a result, the low voltage drive can be realized and the read rate can be increased without increasing the area of a memory cell.

In addition, the precharge potential applied to the sense line is set at a low level, the sense line works as a source line differently from the case where the sense line is precharged up to a high potential. Therefore, the read current can be further increased, and the read rate can be further increased.

Furthermore, when the read rate is set at an allowable value, the transistors included in the memory cell can be decreased in size as well as a current consumed in the circuit can be decreased.

Alternatively, the data holding circuit of this invention comprises a data holding unit including a first inverter and a second inverter connected with each other through an output node of one of the first and second inverters and an input node of the other, and a supply potential applied to the data holding unit during a write period is set to be lower than a supply potential applied to peripheral circuits of the data holding unit.

In this data holding circuit, the supply potential applied to the data holding unit during a write period is set to be lower than the supply potential applied to the peripheral circuits of the data holding unit. Therefore, in the case where the first and second inverters include CMOSFETs, the data latching ability of the drive transistor of a high data holding portion is degraded in a write period. As a result, an inverted write operation, which requires longest write time, can be easily conducted, thereby increasing the speed of a write operation.

Alternatively, the data holding circuit of this invention comprises a data holding unit including a first inverter and a second inverter connected with each other through an output node of one of the first and second inverters and an input node of the other, and a supply potential applied to the data holding unit during a write period is set to be lower than a supply potential applied to the data holding unit during a read period.

In this data holding circuit, the supply potential applied to the data holding unit during a write period is set to be lower than the supply potential applied to the data holding unit during a read period. Therefore, in the case where the first and second inverters include CMOSFETs, the data latching ability of the drive transistor of a high data holding portion is degraded in a write period. As a result, an inverted write operation, which requires longest write time, can be easily conducted, thereby increasing the speed of a write operation.

Alternatively, the data holding circuit of this invention comprises a data holding unit including a first inverter and a second inverter connected with each other through an output node of one of the first and second inverters and an input node of the other, and a ground potential applied to the data holding unit during a write period is set to be higher than a ground potential applied to peripheral circuits of the data holding unit.

In this data holding circuit, the ground potential applied to the data holding unit during a write period is set to be higher than the ground potential applied to the peripheral circuits of the data holding unit. Therefore, in the case where the first and second inverters include CMOSFETs, the data latching ability of the drive transistor of a low data holding portion is improved. As a result, an inverted write operation, which requires longest write time, can be easily conducted, thereby increasing the speed of a write operation.

Alternatively, the data holding circuit of this invention comprises a data holding unit including a first inverter and a second inverter connected with each other through an output node of one of the first and second inverters and an input node of the other, and a ground potential applied to the data holding unit during a write period is set to be higher than a ground potential applied to the data holding unit during a read period.

In this data holding circuit, the ground potential applied to the data holding unit during a write period is set to be higher than the ground potential applied to the data holding unit during a read period. Therefore, in the case where the first and second inverters include CMOSFETs, the data latching ability of the drive transistor of a low data holding portion is improved in a write period. As a result, an inverted write operation, which requires longest write time, can be easily conducted, thereby increasing the speed of a write operation.

Alternatively, the data holding circuit of this invention comprises a first inverter and a second inverter, each of which includes of a P-type transistor and an N-type transistor, connected with each other through an output node of one of the first and second inverters and an input node of the other, and a well potential of the P-type transistor during a read period is set to be lower than a well potential of the P-type transistor during a write period.

In this data holding circuit, the well potential of the P-type transistor during a read period is set to be lower than the well potential of the P-type transistor during a write period. Therefore, in the case where a sense line for reading a data from the data holding unit is precharged up to a high potential, the threshold voltage of the P-type load transistor during a read period is decreased due to the substrate bias effect, thereby improving the drive ability of the load transistor. As a result, the drive ability of an N-type drive transistor during a read period can be improved. Thus, the speed of a read operation can be increased and a noise margin can be enlarged without increasing a leakage current.

In addition, also in the case where the sense line is precharged up to a low potential, the threshold voltage of the P-type drive transistor is decreased due to the substrate bias effect, thereby improving the drive ability of the drive transistor. Thus, a read operation can be rapidly conducted and the noise margin can be enlarged.

Alternatively, the data holding circuit of this invention comprises a first inverter and a second inverter, each of which includes a P-type transistor and an N-type transistor, connected with each other through an output node of one of the first and second inverters and an input node of the other, and a well potential of the N-type transistor during a read period is set to be higher than a well potential of the N-type transistor during a write period.

In this data holding circuit, the well potential of the N-type transistor during a read period is set to be lower than the well potential of the N-type transistor during a write period. Therefore, in the case where a sense line for reading a data from the data holding unit is precharged up to a high potential, the threshold voltage of the N-type drive transistor is decreased due to the substrate bias effect, thereby improving the drive ability of the drive transistor during a read period.

In addition, also in the case where the sense line is precharged up to a low potential, the threshold voltage of the N-type load transistor is decreased due to the substrate bias effect, thereby improving the drive ability of the load transistor. As a result, the drive ability of a P-type drive transistor during a read period is improved. Thus, a read operation can be rapidly conducted and a noise margin can be enlarged without increasing a leakage current.

Alternatively, the data holding circuit of this invention comprises a first inverter and a second inverter, each of which includes a P-type transistor and an N-type transistor, connected with each other through an output node of one of the first and second inverters and an input node of the other, and a well potential of the P-type transistor during a write period is set to be lower than a well potential of the P-type transistor during a read period.

In this data holding circuit, the well potential of the P-type transistor during a write period is set to be lower than the well potential of the P-type transistor during a read period. Therefore, the threshold voltage of the P-type transistor during a write period is decreased due to the substrate bias effect, thereby improving the drive ability of this transistor.

Alternatively, the data holding circuit of this invention comprises a first inverter and a second inverter, each of which includes a P-type transistor and an N-type transistor, connected with each other through an output node of one of the first and second inverters and an input node of the other, and a well potential of the P-type transistor during a write period is set to be higher than a well potential of the P-type transistor during a read period.

In this data holding circuit, the well potential of the P-type transistor during a write period is set to be higher than the well potential of the P-type transistor during a read period. Therefore, the threshold voltage of the P-type transistor during a write period is increased due to the substrate bias effect, thereby degrading the drive ability of the P-type transistor. As a result, an inverted write operation can be easily conducted, thereby attaining a high speed write operation without increasing the transistors in size.

Alternatively, the data holding circuit of this invention comprises a first inverter and a second inverter, each of which includes a P-type transistor and an N-type transistor, connected with each other through an output node of one of the first and second inverters and an input node of the other, and a well potential of the N-type transistor during a write period is set to be lower than a well potential of the N-type transistor during a read period.

In this data holding circuit, the well potential of the N-type transistor during a write period is set to be lower than the well potential of the N-type transistor during a read period. Therefore, the threshold voltage of the N-type transistor during a write period is increased due to the substrate bias effect, thereby degrading the drive ability of the N-type transistor. As a result, an inverted write operation can be easily conducted, thereby attaining a high speed write operation without increasing the transistors in size.

Alternatively, the data holding circuit of this invention comprises a first inverter and a second inverter, each of which includes a P-type transistor and an N-type transistor, connected with each other through an output node of one of the first and second inverters and an input node of the other, and a well potential of the N-type transistor during a write period is set to be higher than a well potential of the N-type transistor during a read period.

In this data holding circuit, the well potential of the N-type transistor during a write period is set to be higher than the well potential of the N-type transistor during a read period. Therefore, the threshold voltage of the N-type transistor during a write period is decreased due to the substrate bias effect, thereby improving the drive ability of this transistor.

In this manner, in the data holding circuit of this invention, the drive abilities of the respective transistors can be independently optimized in a read operation and a write operation. Accordingly, it is possible to avoid a phenomenon, resulting from too much priority of a read rate, that a high data and a low data cannot be replaced with each other.

Furthermore, when the read rate and the write rate are set at allowable values, the transistors included in the memory cell can be decreased in size. This results in further integration of the circuit.

BRIEF DESCRIPTION OF THE DRAWINGS

FIGS. 3(a) through 3(d) illustrate comparison in the operation speed on the basis of a precharge potential of a bit line in the SRAM memory cell of the first embodiment, wherein FIG. 3(a) is an equivalent circuit diagram of the memory cell when the bit line is precharged up to a high potential, FIG. 3(b) is a graph for showing the result of simulation regarding the relationships between time and voltages of a word line, the bit line and a first memory node when the bit line is highly precharged, FIG. 3(c) is an equivalent circuit diagram of the memory cell when the bit line is precharged up to a low potential, and FIG. 3(d) is a graph for showing the result of simulation regarding the relationships between time and voltages of the word line, the bit line and the first memory node when the bit line is lowly precharged;

DETAILED DESCRIPTION OF THE INVENTION (Embodiment 1)

A first embodiment of the invention will now be described with reference to the drawings.

Figure 1:
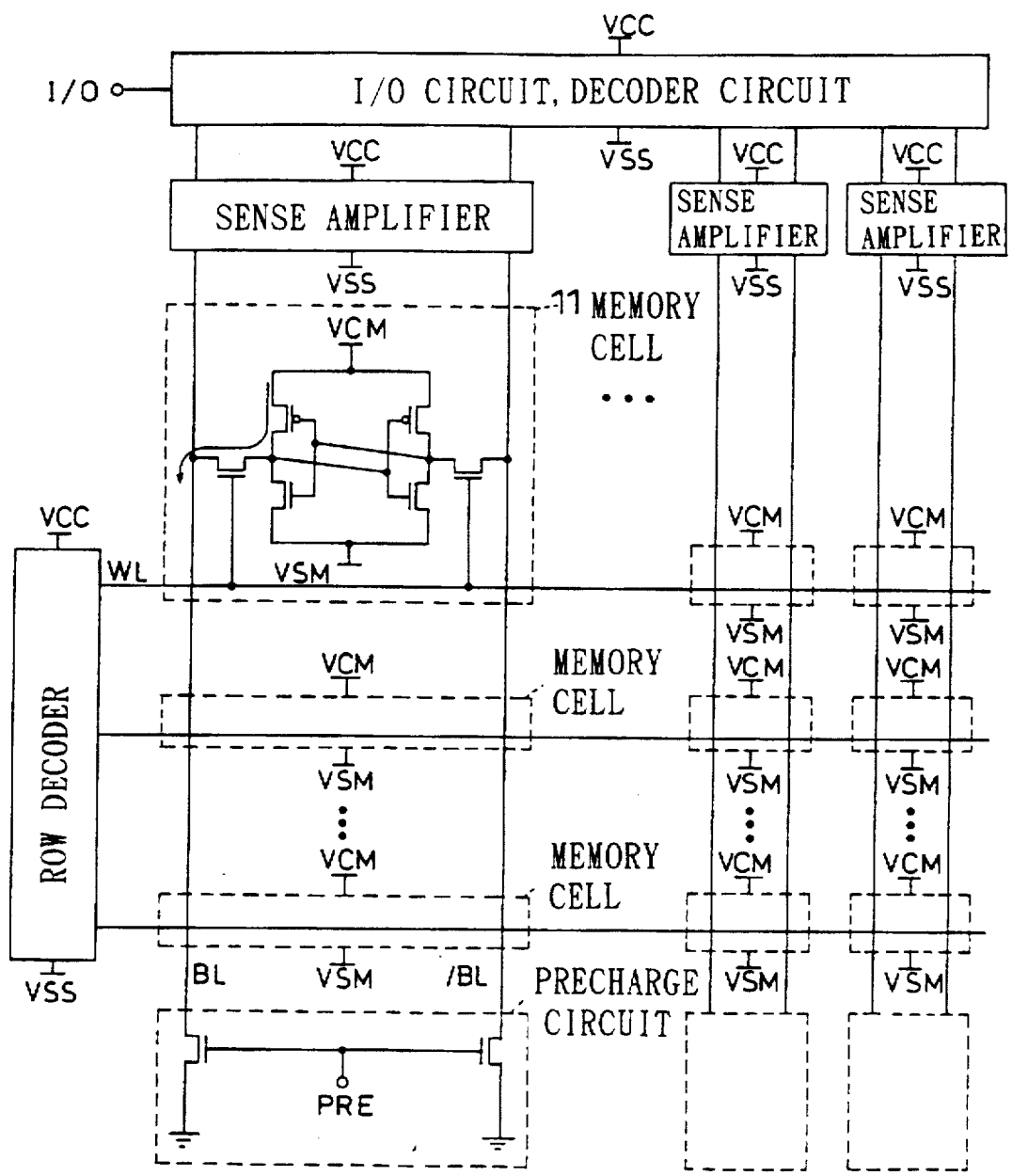
FIG. 1 is a circuit diagram of a data holding circuit according to a first embodiment of the invention.
Figure 2:
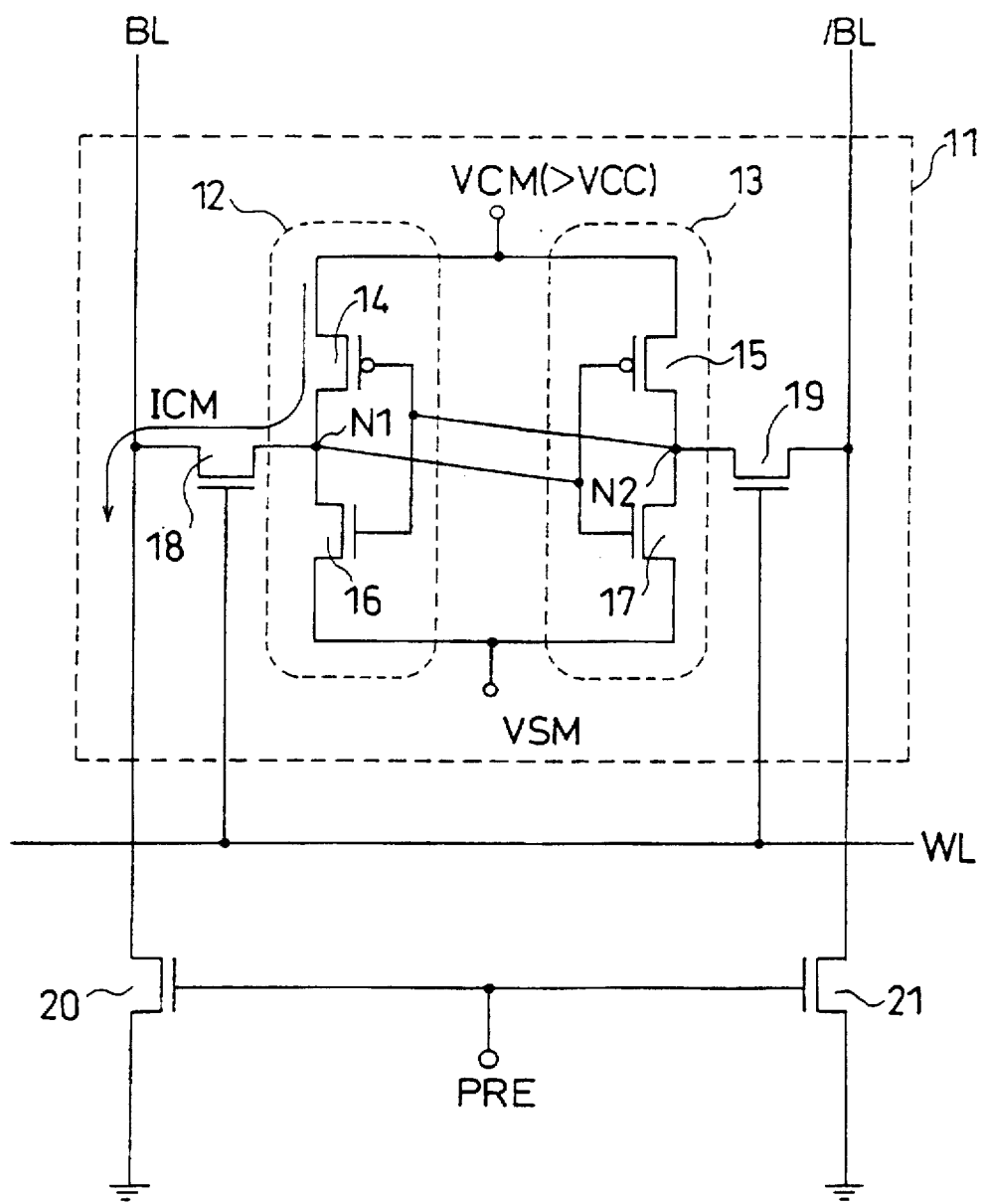
FIG. 2 is a circuit diagram of a memory cell in the data holding circuit of the first embodiment.

FIG. 1 is a circuit diagram of an SRAM memory cell exemplified as a data holding circuit of the first embodiment and its peripheral circuits, and FIG. 2 is a circuit diagram of the SRAM memory cell of this embodiment. In FIG. 1, a memory cell 11 is one of memory cells aligned in the form of an array. A row decoder, which selects one of word lines in accordance with an externally input row address, is supplied with a ground potential VSS and a supply potential VCC, and is connected with the memory cells 11 aligned in the row direction through each word line WL. An I/O circuit controls a read operation and a write operation. A decoder circuit for decoding an externally input column address is connected with the memory cells 11 aligned in the column direction through each bit line pair BL and /BL serving as sense lines. A sense amplifier amplifies a small read current flowing through the bit line pair BL and /BL in a read operation. A memory cell supply potential VCM for driving the memory cell 11 is a supply potential for holding a high data and is controlled independently from the supply potential VCC for the peripheral circuits such as the row decoder. A memory cell ground potential VSM is a ground potential for holding a low data and is controlled independently from the ground potential VSS for the peripheral circuits such as the row decoder.

As is shown in FIG. 2, the memory cell 11 includes a first inverter 12, a second inverter 13, a first access transistor 18 and a second access transistor 19. Specifically, assuming that the bit line pair BL and /BL for accessing the memory cells 11 aligned in the column direction of the array are precharged up to the ground potential VSS while switch transistors 20 and 21 are being activated by a supply potential PRE, the first inverter 12 includes a PMOS transistor as a first drive transistor 14 and an NMOS transistor as a first load transistor 16. The second inverter 13 pairing with the first inverter 12 includes a PMOS transistor as a second drive transistor 15 and an NMOS transistor as a second load transistor 17.

The output node of the first inverter 12, serving as a first memory node N1 of the memory cell 11, is connected with the gate electrodes of the second drive transistor 15 and the second load transistor 17 serving as the input node of the second inverter 13. Also, the output node of the second inverter 13, serving as a second memory node N2 of the memory cell 11, is connected with the gate electrodes of the first drive transistor 14 and the first load transistor 16 serving as the input node of the first inverter 12. The word line WL for accessing the memory cells 11 aligned in the column direction of the array is connected with the gate electrode of the first access transistor 18 interposed between the bit line BL and the first memory node N1, and with the gate electrode of the second access transistor 19 interposed between the bit complementary line /BL and the second memory node N2.

Data held in the first memory node N1 and the second memory node N2 are determined by the latching states of the first memory node N1 and the second memory node N2, and the first and second memory nodes N1 and N2 have potentials reverse to each other. For example, when the potential of the first memory node N1 is at a high level, the potential of the second memory node N2 is at a low level. In the case where the first memory node N1 has a high potential and the second memory node N2 has a low potential, the gate electrodes of the first drive transistor 14 and the first load transistor 16 are both connected with the second memory node N2. Therefore, the first drive transistor 14 is in an on-state and the first load transistor 16 is in an off-state. Furthermore, since the gate electrodes of the second drive transistor 15 and the second load transistor 17 are connected with the first memory node N1, the first drive transistor 15 is in an off-state and the second load transistor 17 is in an on-state. Accordingly, the first memory node N1 keeps on holding a high data and the second memory node N2 keeps on holding a low data.

In a read operation, when the memory cell 11 is selected in accordance with an address for specifying one of the memory cells in the memory cell array, the potential of the word line WL connected with the selected memory cell 11 is changed to a high potential, i.e., the supply potential VCC, and hence, the first memory node N1 is connected with the bit line BL and the second memory node N2 is connected with the bit complementary line /BL. At this point, since the bit line pair BL and /BL are precharged up to a low potential, that is, the ground potential VSS, there is no change in a portion including the second memory node N2 holding the low data. In a portion including the first memory node N1 holding the high data, however, a read current ICM flows into the bit line BL through the first access transistor 18 and the first drive transistor 14. This read current ICM is detected by a sense amplifier as a difference in the current or the potential between the bit line pair BL and /BL, so as to be transferred to the outside as a desired data.

In order to increase the data transfer rate in a read operation, the drive ability of any of the first access transistor 18, the second access transistor 19, the first drive transistor 14 and the second drive transistor 15 is improved.

The drive ability of a transistor can be improved by increasing the size of the transistor, but the upsizing of a transistor is not preferred because it results in proportionally increasing the area of the memory cell. Also, the decrease of the threshold voltage of the transistor can be effective in improving the drive ability of the transistor. However, when the threshold voltage of a transistor is decreased, the threshold voltage can be more largely affected by process variation, which results in problems of great increase of a leakage current and decrease of a noise margin.

In the data holding circuit of the first embodiment, the memory cell supply potential VCM corresponding to the source potential of the first drive transistor 14 and the second drive transistor 15 included in the memory cell 11 is set to be higher than the supply potential VCC for the peripheral circuits. As a result, the drive abilities of the drive transistors 14 and 15 can be improved.

For example, the read current ICM supplied through the first drive transistor 14 depends upon the gate-source potential of the first drive transistor 14, so that as the gate-source potential is higher, the read current ICM becomes larger, resulting in a high read rate. Contrary, when the memory cell supply potential VCM is suppressed to a necessary lowest limit in order to achieve a desired operation speed, a current to be consumed can be prevented from being wastefully increased, as well as the first and second drive transistors can be minimized in size.

Furthermore, when the memory cell ground potential VSM corresponding to the supply potential for the first load transistor 16 and the second load transistor 17 included in the memory cell 11 is set to be lower than the ordinary ground potential VSS, a voltage applied to the gate electrode of the first drive transistor 14 is made low, so that the gate-source potential of the first drive transistor 14 can be increased. As a result, the value of the read current ICM can also be increased. In addition, when the memory cell ground potential VSM is set to be lower than the ordinary ground potential VSS, a desired drive ability required of the load transistors 16 and 17 can be attained with a small transistor size, resulting in decreasing the area of the memory cell.

The memory cell supply potential VCM can be set at a larger value than the supply potential VCC for the peripheral circuits independently from the memory cell ground potential VSM set at a smaller value than the ordinary ground potential VSS, and hence, one of them alone can be thus set.

Furthermore, when the precharge potential of the bit line pair BL and /BL is at a high level, the first load transistor 16 and the second load transistor 17 work as the drive transistors, and the first drive transistor 14 and the second drive transistor 15 work as the load transistors. Accordingly, similarly to the case where the precharge potential of the bit line pair BL and /BL is at a low level, the memory cell supply potential VCM to be applied to the load transistors is set to be higher than the supply potential VCC, so that a difference in the potentials applied to the source electrodes of these transistors is increased. Thus, a read rate can be increased without increasing the area of the memory cell 11.

Additionally, since the drive ability of the drive transistors is made higher than that of the access transistors 18 and 19 without upsizing the drive transistors, the drive ability of the access transistors 18 and 19 can also be improved without increasing the area of the memory cell 11 by decreasing the threshold voltage of the access transistors 18 and 19. In this case, a leakage current can flow into the memory cell 11 through the access transistors 18 and 19 during a stand-by period. However, when the memory cell ground potential VSM and the precharge potential of the bit lin BL are set to be higher than the gate potential of the access transistors (corresponding to the potential of the word line WL) during the stand-by period, a negative voltage can be applied between the gate and the source of the access transistors 18 and 19 of the NMOS transistors, thereby suppressing the leakage current. With regard to the relative relationship in the potential among the word line WL, the memory cell ground potential VSM and the bit line BL, the potential of the word line WL is set to be lower than the ground potential VSM and the potential of the bit line BL during a stand-by period, which can be attained by controlling any of the potential of the word line WL, the memory cell ground potential VSM and the potential of the bit line BL.

In this connection, the memory cell supply potential VCM to be applied to the memory cell 11 can be set at a larger value than the supply potential VCC for the peripheral circuits not only during a read operation but also constantly, as far as it is a sufficient potential for conducting a write operation.

Now, the operations of the data holding circuit will be described with regard to the cases where the bit line is precharged up to a high potential and a low potential.

FIGS. 3(a) through 3(d) show the comparison in the operation speed of the SRAM memory cell of this embodiment between the high precharge potential and the low precharge potential.

Figure 3A:
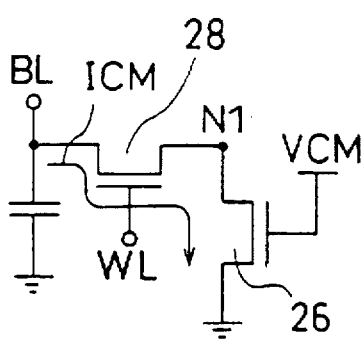
Figure 3B:
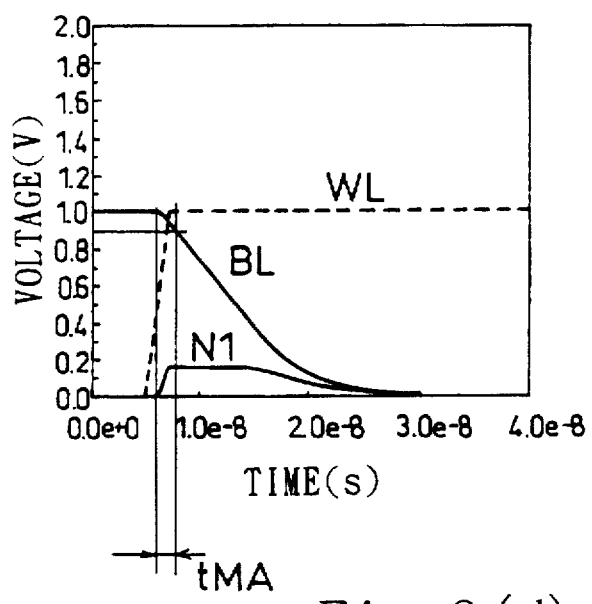
Figure 3C:
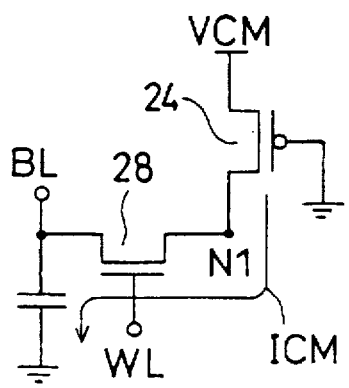

FIG. 3(a) is an equivalent circuit diagram of a reading portion of the memory cell when the bit line is highly precharged, and FIG. 3(c) is an equivalent circuit diagram of the reading portion when the bit line is lowly precharged.

The memory cell equivalent circuit of FIG. 3(a) illustrates one transistor, among the transistors included in the SRAM memory cell, through which the read current ICM flows, with the bit line BL highly precharged and the first memory node N1 holding a low data. In the memory cell equivalent circuit of FIG. 3(a), a transistor working as the drive transistor when the bit line BL is highly precharged is an NMOS transistor 26 which is supplied with the ground potential at its source electrode. When the supply potential VCC is applied to the word line WL so as to start a read operation on the memory cell, the bit line BL is discharged through an access transistor 28 and the drive transistor 26, so as to decrease the potential of the bit line BL. At this point, the source electrode of the access transistor 28 corresponds to the first memory node N1, and since the capacitance of the bit line BL is much larger than that of the firs memory node N1, the potential of the first memory node N1 is increased in accordance with the conductance ratio between the access transistor 28 and the drive transistor 26. As a result, the gate-source potential of the access transistor 28 is decreased, thereby degrading the drive ability of the access transistor 28.

The memory cell equivalent circuit of FIG. 3(c) illustrates one transistor, among the transistors included in the SRAM memory cell, through which the read current ICM flows, with the bit line BL lowly precharged and the first memory node N1 holding a high data. In the memory cell equivalent circuit of FIG. 3(c), a transistor working as the drive transistor when the bit line BL is lowly precharged is a PMOS transistor 24 which is supplied with the memory cell supply potential VCM at its source electrode. When the supply potential VCC is applied to the word line WL so as to start a read operation on the memory cell, the bit line BL is charged through an access transistor 28 and the drive transistor 24, so as to increase the potential of the bit line BL. At this point, since the source electrode of the access transistor 28 is connected with the bit line BL, the drive ability of the access transistor 28 is high immediately after starting the read operation. As the potential of the bit line BL increases, the drive ability of the access transistor 28 is gradually degraded. When the potential of the bit line BL reaches a potential lower than the high potential of the word line WL by the threshold voltage of the access transistor 28, the drive ability of the access transistor 28 is lost, resulting in cutting off the read current.

Figure 3D:
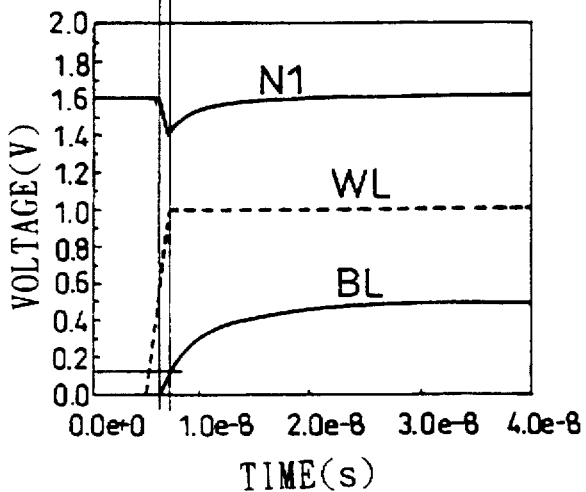

FIG. 3(b) is a graph for showing the result of simulation regarding the relationships between time and voltages of the word line WL, the bit line BL and the first memory node N1 when the bit line BL is highly precharged, and FIG. 3(d) is a graph showing the result of simulation regarding the relationships between time and voltages of the word line WL, the bit line BL and the first memory node N1 when the bit line BL is lowly precharged.

Immediately after starting a read operation on the memory cell by activating the word line WL, in the case where the bit line BL is highly precharged as is shown in FIG. 3(b), the potential of the first memory node N1 corresponding to the source electrode of the access transistor becomes higher than the ground potential by approximately 0.2 V, thereby decreasing the gate-source potential of the access transistor 28. In contrast, in the case where the bit line BL is lowly precharged as is shown in FIG. 3(d), the source electrode of the access transistor 28 is connected with the bit line BL, and hence, the gate-source potential of the access transistor 28 is higher than in the case where the bit line is highly precharged.

Accordingly, when time for causing a potential difference of 100 mV between the bit line pair BL and /BL is indicated as read time tMA, the read time tMA is shorter in the case of the low precharge shown in FIG. 3(d) than in the case of the high precharge shown in FIG. 3(b). In this connection, a sensible potential difference between the bit line pair BL and /BL is generally several tens mV, although this can be affected by the configuration of the sense amplifier.

Furthermore, as is shown in FIG. 3(d), when time passes from the start of the read operation, the potential of the bit line BL corresponding to the source potential of the access transistor 28 is changed. When the gate-source potential of the access transistor 28 is decreased to its threshold voltage, the charge/discharge of the bit line BL is stopped. Thus, a wasteful charge/discharge current can be prevented from flowing through the bit line without providing an additional control circuit.

In the case where the access transistor 28 of FIGS. 3(a) and 3(c) is a PMOS transistor, the source potential of the access transistor 28 corresponds to the potential of the bit line BL in the case of the high precharge contrary to the above description. Therefore, the gate-source potential of the access transistor 28 is higher in the case of the high precharge than in the case of the low precharge. Accordingly, the read time tMA is shorter in the case of the high precharge than in the case of the low precharge.

(Embodiment 2)

A second embodiment of the invention will now be described with reference to the drawing.

In the first embodiment, the memory cell supply potential VCM to be applied to the drive transistor is set at a large value in order to improve a read rate. However, when the drive ability of the drive transistor is high in a write operation, time required for inverting a data is increased, or a data cannot be inverted according to circumstances.

In view of this problem, the memory cell supply potential VCM is decreased in a write operation in this embodiment, so as to improve a write rate.

Figure 4:
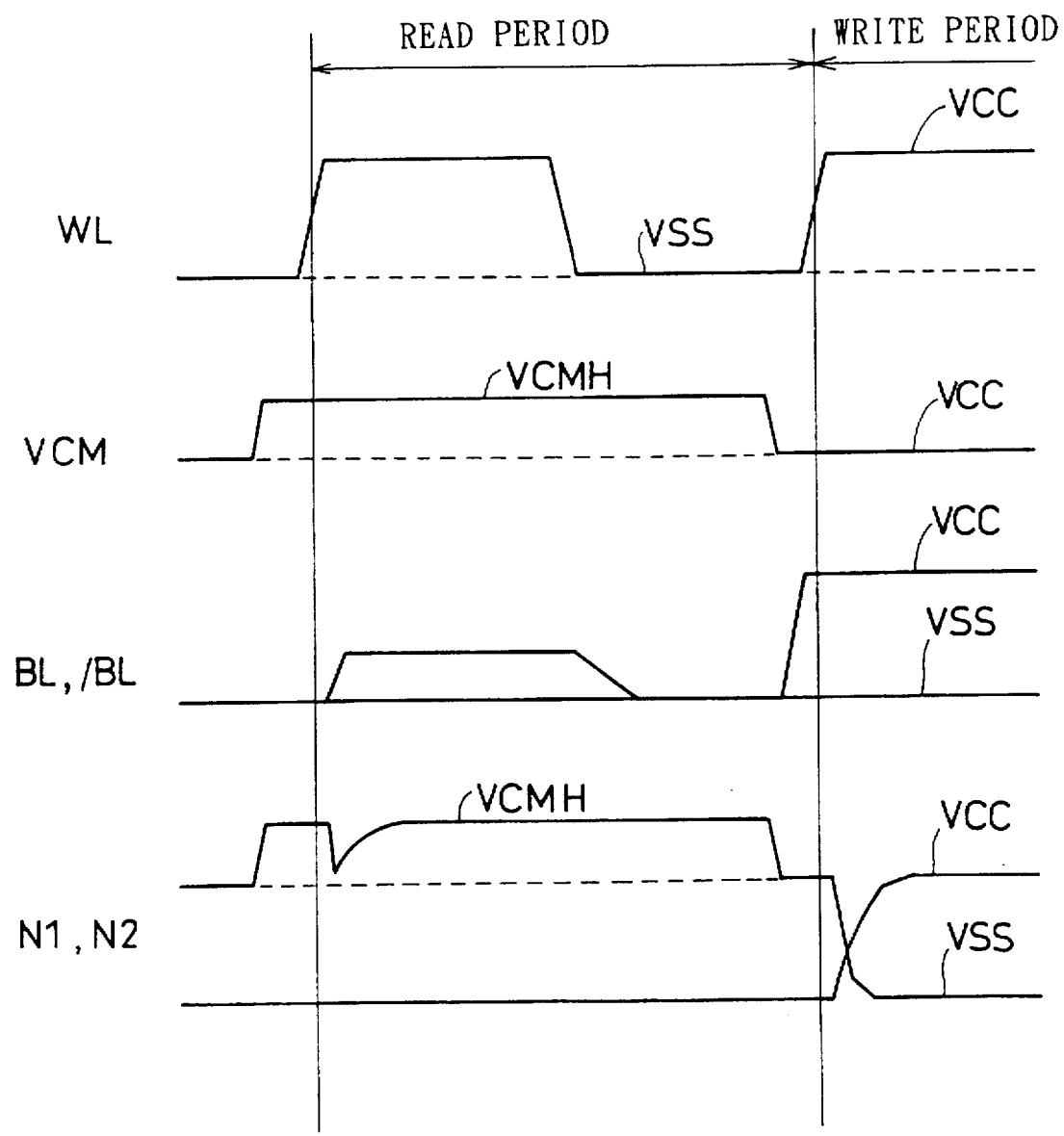
FIG. 4 is a control sequence diagram in a data holding circuit according to a second embodiment of the invention.

FIG. 4 is a control sequence diagram for an SRAM exemplified as a data holding circuit of the second embodiment. In FIG. 4, WL denotes a potential to be applied to the word line, VCM denotes a memory cell supply potential, BL and /BL denote potentials to be applied to a bit line pair, and N1 and N2 denote potentials of first and second memory nodes. Also, VSS denotes a ground potential for peripheral circuits and VCC denotes a supply potential for the peripheral circuits. In addition, the memory cell supply potential VCM at a low level is assumed to be equal to the supply potential VCC and that at a high level is indicated as VCMH. The data holding circuit of this embodiment has the same configuration as the SRAM memory cell shown in FIG. 2.

As is shown in FIG. 4, the potentials of the first memory node N1 and the second memory node N2 are complementary to each other before a read operation, with one of the potentials is at the supply potential VCC and the other at the ground potential VSS.

Description will be first made on a read period. Immediately before starting a read operation, the memory cell supply potential VCM is increased to the high potential VCMH, so as to increase the potential of the memory node holding a high data to the high potential VCMH. When the word line WL is activated to start the read operation, the potential of the memory node holding the high data is once decreased. However, since the drive ability of the drive transistor is improved as described in the first embodiment, the data cannot be erased through this voltage decrease. When the read operation is completed, the memory cell supply potential VCM is decreased from the high potential VCMH to the supply potential VCC, and the potentials of the first and second memory nodes N1 and N2 are also returned to the supply potential VCC and the ground potential VSS.

Next, a write period will be described. When the word line WL is activated to start a write operation, in the case where a held data is different from a data to be written, which is designated as inverted write, the potential of the memory node holding a high data is decreased and the potential of the other memory node holding a low data is increased at the same time. Since the memory cell supply potential VCM is set at the supply potential VCC lower than the high potential VCMH during a write operation, the drive ability of the drive transistor is also decreased. Therefore, the amount of the voltage decrease in the memory node holding the high data is larger, and hence, the potentials of the memory nodes are replaced with each other, resulting in correctly writing the data.

In this embodiment, the memory cell supply potential VCM is increased to the high potential VCMH in a read period and is decreased to the supply potential VCC lower than the high potential VCMH in a write period, but this potential change does not limit the invention. When the memory cell 11 is supplied with the supply potential VCC in a read period and with a potential lower than the supply potential VCC in a write period, the same effects can be attained.

Furthermore, with regard to the supply potential VCM for the memory cell 11 during a stand-by period, since the gate-source potential of the transistor through which a leakage current can flow is 0 V, the leakage current cannot increase even when the memory cell supply potential VCM is set at the high potential VCMH higher than the ordinary supply potential VCC. In addition, when the memory cell supply potential VCM in the stand-by period is set at a large value, the memory cell can be free from the effect of a noise such as a soft error, resulting in an improved data holding characteristic.

Moreover, as is shown in FIG. 4, the memory cell supply potential VCM is increased from the supply potential VCC to the high potential VCMH before starting a read period, and the memory cell supply potential VCM is decreased from the high potential VCMH to the supply potential VCC before starting a write period. This is an example of techniques to securely complete a read or write operation in the read or write period, and the memory cell supply potential VCM is not necessarily changed before the respective periods.

Alternatively, the write ability can be improved also by setting the memory cell ground potential VSM at a large value in a write period. When the access transistors 18 and 19 are composed of NMOS transistors, a write operation is conducted by destroying a high data in the memory cell 11 with the potential of the bit line BL at a low level. However, as described in the first embodiment, a read current of the memory cell 11 is too much increased and the data holding power is so much improved that the high data in the memory cell 11 cannot be destroyed by applying a voltage of 0 V to the bit line BL. Therefore, by increasing the memory cell ground potential VSM in a write operation, the data holding property is degraded, and the memory cell ground potential VSM is increased to some extend so that a data can be written. This technique will now be described with reference to FIG. 2.

First, it is assumed that a high data is held by the first memory node N1. Under this condition, the supply potential VCC is applied to the word line WL, the access transistors 18 and 19 are turned on, and the low potential is applied to the bit line BL and the high potential is applied to the bit complementary line /BL. Then, the potential of the first memory node N1 is extracted into the bit line BL and decreased. However, when the memory cell supply potential VCM is high, the potential of the first memory node N1 cannot be sufficiently decreased for allowing the inverter 13 to conduct an inverting operation. Accordingly, the write operation cannot be completed.

Therefore, the memory cell ground potential VSM is increased, so that the potential at which the inverter 13 conducts an inverting operation is increased. In addition, since the potential of the second memory node N2 is set at the memory cell ground potential VSM, the gate potential of the first drive transistor 14 is increased. As a result, a current flowing through the first drive transistor 14 is decreased and the potential of the first memory node N1 is also decreased. In this manner, by increasing the memory cell ground potential VSM, a write level (i.e., a potential of the bit line BL at which a data held by the memory cell 11 can be inverted) is increased resulting in increasing a write rate.

It goes without saying that the memory cell ground potential VSM during a stand-by period is not specified as far as it has a sufficient voltage value for holding a data. However, when the ground potential VSM in a stand-by period is conformed to that in a write period, transistors with a low threshold voltage can be used as the access transistors 18 and 19 without applying a negative voltage to the word line WL (because the gate-source voltage of the access transistors 18 and 19 is negative when the potential of the bit line BL is higher than that of the deactivated word line WL). Thus, a read operation can be conducted more rapidly.

In this manner, for example, with constantly setting the memory cell supply potential VCM to be higher than the supply potential VCC for the peripheral circuits, the memory cell ground potential VSM is set to be higher than the ground potential VSS for the peripheral circuits in a write period and a stand-by period and is set at the ground potential VSS merely in a read operation, and transistors with a low threshold voltage are used as the access transistors 18 and 19. Thus, a high speed operation in the read period as well as a small leakage current characteristic in the write and stand-by periods can be attained.

When the access transistors 18 and 19 are composed of PMOS transistors, a write operation is conducted by inverting a low data held by the memory cell 11 with the potential of the bit line BL at a high level. Accordingly, by increasing the memory cell ground potential VSM in a write operation as compared with that in a read operation, or by decreasing the memory cell supply potential VCM, a write operation can be rapidly conducted. Also in this case, the memory cell supply potential VCM in a stand-by period is set to be lower than the potential of the deactivated word line WL (=VCC) as in a write operation. Thus, a leakage current can be suppressed even when the transistors with a low threshold voltage are used as the access transistors 18 and 19.

(Embodiment 3)

A third embodiment of the invention will now be described with reference to the drawing.

Figure 5:
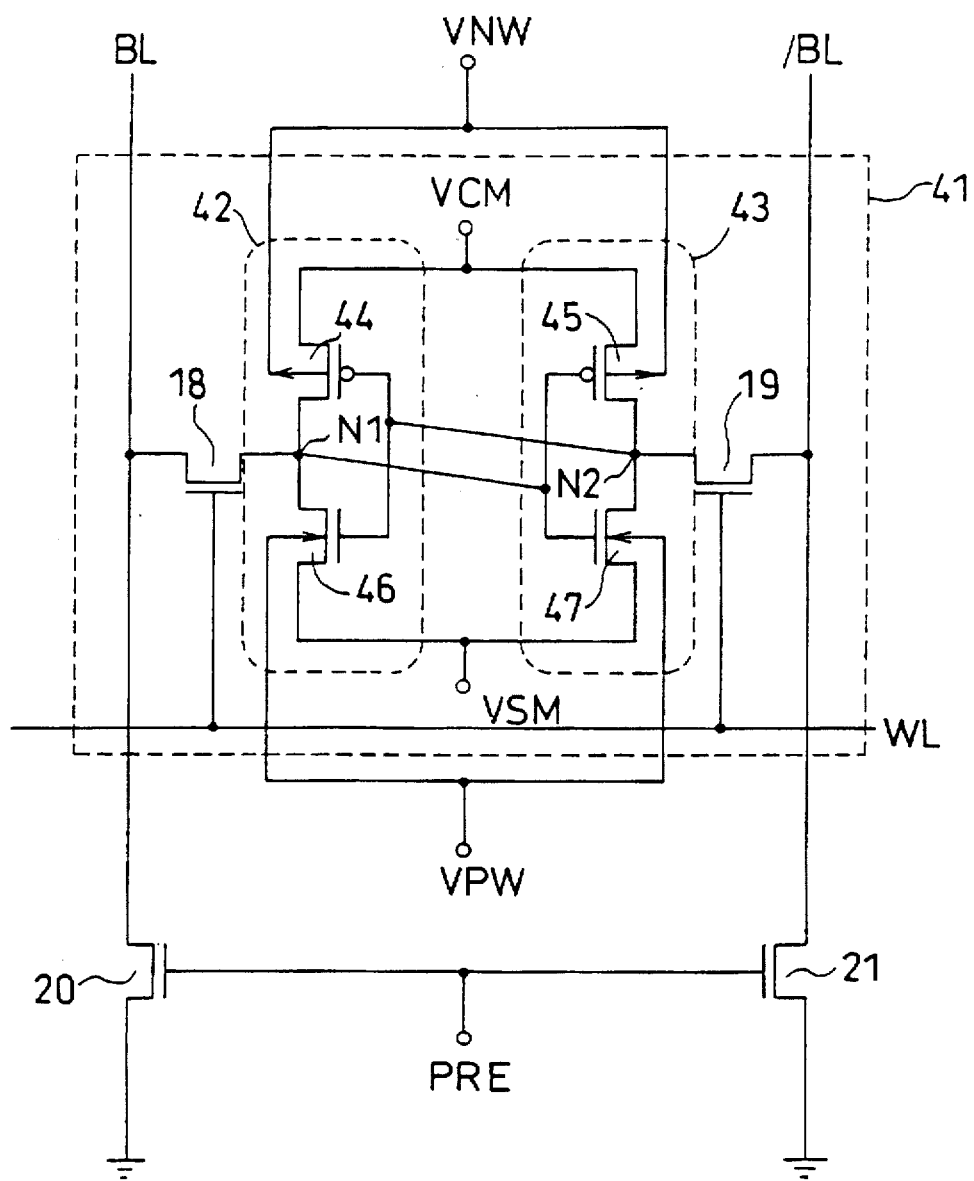
FIG. 5 is a circuit diagram of a memory cell in a data holding circuit according to a third embodiment of the invention.
Figure 6:
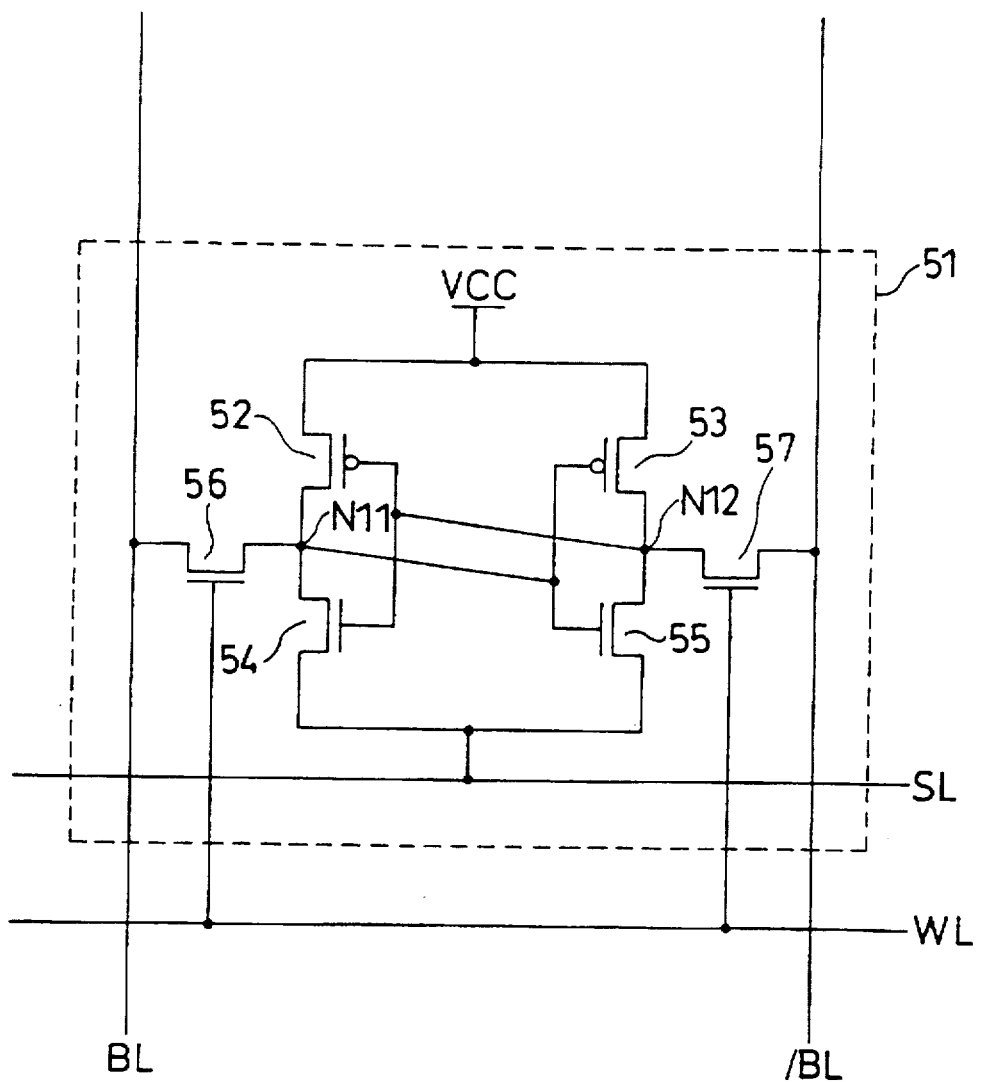
FIG. 6 is a circuit diagram of a conventional low-voltage driven SRAM memory cell.

FIG. 5 is a circuit diagram of an SRAM memory cell exemplified as a data holding circuit of the third embodiment. In FIG. 5, a memory cell 41 is one of memory cells aligned in the form of an array, and includes a first inverter 42, a second inverter 43, a first access transistor 18 and a second access transistor 19. When the precharge potential of the bit line BL is at a low level, the first inverter 42 includes a PMOS transistor as a first drive transistor 44 and an NMOS transistor as a first load transistor 46. The second inverter 43 paring with the first inverter 42 includes a PMOS transistor as a second drive transistor 45 and an NMOS transistor as a second load transistor 47.

The output node of the first inverter 42 serving as a first memory node N1 of the memory cell 41 is connected with the gate electrodes of the second drive transistor 45 and the second load transistor 47 serving as the input node of the second inverter 43. Also, the output node of the second inverter 43 serving as a second memory node N2 of the memory cell 41 is connected with the gate electrodes of the first drive transistor 44 and the first load transistor 46 serving as the input node of the inverter 42. A word line WL for accessing the memory cells 41 aligned in the row direction of the memory cell array is connected with the gate electrode of the first access transistor 18 interposed between the bit line BL and the first memory node N1 and with the gate electrode of the second access transistor 19 interposed between the bit complementary line /BL and the second memory node N2.

Substrates of the first drive transistor 44 and the second drive transistor 45 are supplied with a first well potential VNW, and substrates of the first load transistor 46 and the second load transistor 47 are supplied with a second well potential VPW.

As is described in the first embodiment, in order to increase a read rate without increasing the area of the memory cell, although the decrease of the threshold voltage of the transistors is effective, this is not preferable because the decrease results in the increase of a leakage current in a stand-by period.

In this embodiment, by controlling the well potentials of the transistors included in the memory cell 41, the threshold voltages of the transistors during a read or write operation and those during a stand-by period are dynamically changed by using the substrate bias effect.

The first drive transistor 44 and the second drive transistor 45 are required to have a high drive ability in a read operation, but the high drive ability is unnecessary in a write operation. Therefore, the first well potential VNW of the drive transistors 44 and 45 is controlled to be lower in a write operation than in a read operation.

Accordingly, the threshold voltage of the drive transistors 44 and 45 of the PMOS transistors is decreased in a read operation alone, so as to improve their drive ability. As a result, a read operation can be rapidly conducted without increasing the area of the memory cell 41 and without increasing a leakage current in a stand-by period.

Furthermore, in a write operation, the first load transistor 46 and the second load transistor 47 are required to have a high drive ability for assisting the write operation, and hence, the second well potential VPW of the load transistors 46 and 47 is controlled to be higher in a write operation than in a read operation.

Accordingly, the threshold voltage of the load transistors 46 and 47 of the NMOS transistors is decreased in a write operation alone, so as to improve their drive ability. As a result, a write operation can be rapidly conducted without increasing the area of the memory cell 41.

When the first and second well potentials VNW and VPW are independently controlled, the respective effects can be attained. Therefore, merely one of the well potentials VNW and VPW can be controlled.

In the case where the precharge potential of the bit line BL is at a high level, the first load transistor 46 and the second load transistor 47 of FIG. 5 work as the drive transistors, and the first drive transistor 44 and the second drive transistor 45 work as the load transistors. Accordingly, the second well potential VPW is increased so the drive ability of the drive transistors 46 and 47 can be improved in a read operation alone, and the first well potential VNW is decreased so the drive ability of the load transistors 44 and 45 of the PMOS transistors can be improved in a write operation alone. Thus, the same effects as described above can be attained.

Now, an SRAM memory cell exemplified as a data holding circuit according to first modification of the third embodiment will be described.

In this modification, the first well potential VNW or the second well potential VPW is controlled so that a noise margin in a read operation can be enlarged.

Specifically, in the case where the bit line BL is lowly precharged, the second well potential VPW of the load transistors 46 and 47 of the NMOS transistors is increased. This decreases the threshold voltage of the load transistors 46 and 47, and hence, the load transistor included in the inverter holding a low data can be more activated. As a result, the drive transistor of the other inverter is more activated. Thus, a read current is increased, thereby enlarging a noise margin.

In the case where the bit line BL is highly precharged, the first well potential VNW of the load transistors 44 and 45 of the PMOS transistors is decreased. This decreases the threshold voltage of the load transistors 44 and 45, and hence, the load transistor in the inverter holding a high data is more activated. As a result, the drive transistor in the other inverter is more activated. Thus, a read current is increased, thereby enlarging a noise margin.

Now, an SRAM memory cell exemplified as a data holding circuit according to second modification of the third embodiment will be described.

In this modification, the first well potential VNW of the PMOS transistors is increased in a write operation, so as to increase the threshold voltage of the PMOS transistors. This degrades the drive ability of the PMOS transistors, and hence, an inverted write operation can be easily conducted, resulting in attaining a high speed write operation.

Now, an SRAM memory cell exemplified as a data holding circuit according to third modification of the third embodiment will be described.

In this modification, the second well potential VPW of the NMOS transistors is increased in a write operation, so as to increase the threshold voltages of the NMOS transistors. This degrades the drive ability of the NMOS transistors, and hence, an inverted write operation can be easily conducted, resulting in attaining a high speed write operation.

It goes without saying that a data holding circuit including access transistors 18 and 19 with a reverse polarity to that adopted in this embodiment can exhibit the same effects as those described above.

What is claimed is:

1. A data holding circuit comprising:
   a data holding unit including a first inverter and a second inverter connected with each other through an output node of one of said first and second inverters and an input node of the other,
   wherein a supply potential applied to said data holding unit during a read period is set to be higher than a supply potential applied to said data holding unit during a write period.

2. A data holding circuit comprising:
   a data holding unit including a first inverter and a second inverter connected with each other through an output node of one of said first and second inverters and an input node of the other; and
   a sense line for reading a data from said data holding unit,
   wherein said sense line is precharged up to a low potential, and
   a ground potential applied to said data holding unit during a read period is set to be lower than a ground potential applied to peripheral circuits of said data holding unit.

3. A data holding circuit comprising:
   a data holding unit including a first inverter and a second inverter connected with each other through an output node of one of said first and second inverters and an input node of the other; and
   a sense line for reading a data from said data holding unit, wherein said sense line is precharged up to a low potential, and a ground potential applied to said data holding unit during a read period is set to be lower than a ground potential applied to said data holding unit during a write period.

4. A data holding circuit comprising:

a data holding unit including a first inverter and a second inverter connected with each other through an output node of one of said first and second inverters and an input node of the other, wherein a supply potential applied to said data holding unit during a write period is set to be lower than a supply potential applied to said data holding unit during a read period.

5. A data holding circuit comprising:

a data holding unit including a first inverter and a second inverter connected with each other through an output node of one of said first and second inverters and an input node of the other, wherein a ground potential applied to said data holding unit during a write period is set to be higher than a ground potential applied to peripheral circuits of said data holding unit.

6. A data holding circuit comprising:

a data holding unit including a first inverter and a second inverter connected with each other through an output node of one of said first and second inverters and an input node of the other, wherein a ground potential applied to said data holding unit during a write period is set to be higher than a ground potential applied to said data holding unit during a read period.

7. A data holding circuit comprising:

a first inverter and a second inverter, each of which includes of a P-type transistor and an N-type transistor, connected with each other through an output node of one of said first and second inverters and an input node of the other, wherein a well potential of said P-type transistor during a read period is set to be lower than a well potential of said P-type transistor during a write period.

8. A data holding circuit comprising:

a first inverter and a second inverter, each of which includes a P-type transistor and an N-type transistor, connected with each other through an output node of one of said first and second inverters and an input node of the other, wherein a well potential of said N-type transistor during a read period is set to be higher than a well potential of said N-type transistor during a write period.

9. A data holding circuit comprising:

a first inverter and a second inverter, each of which includes a P-type transistor and an N-type transistor, connected with each other through an output node of one of said first and second inverters and an input node of the other, wherein a well potential of said P-type transistor during a write period is set to be lower than a well potential of said P-type transistor during a read period.

10. A data holding circuit comprising:

a first inverter and a second inverter, each of which includes a P-type transistor and an N-type transistor, connected with each other through an output node of one of said first and second inverters and an input node of the other, wherein a well potential of said P-type transistor during a write period is set to be higher than a well potential of said P-type transistor during a read period.

11. A data holding circuit comprising:

a first inverter and a second inverter, each of which includes a P-type transistor and an N-type transistor, connected with each other through an output node of one of said first and second inverters and an input node of the other, wherein a well potential of said N-type transistor during a write period is set to be lower than a well potential of said N-type transistor during a read period.

12. A data holding circuit comprising:

a first inverter and a second inverter, each of which includes a P-type transistor and an N-type transistor, connected with each other through an output node of one of said first and second inverters and an input node of the other, wherein a well potential of said N-type transistor during a write period is set to be higher than a well potential of said N-type transistor during a read period.

13. A data holding circuit comprising:

a data holding unit including a first inverter and a second inverter connected together through an output node of one of said first and second inverters and an input node of the other of said first and second inverters; and peripheral circuits electrically connected to said data holding unit, wherein a difference between a supply potential and a ground potential applied to said data holding unit during a read period is larger than a difference between a supply potential and a ground potential applied to said data holding unit during a write period, or is larger than a difference between a supply potential and a ground potential applied to said data holding unit during a data holding period, and wherein the difference between the supply potential and the ground potential applied to said data holding unit during the read period is larger than a difference between a supply potential and a ground potential applied to said peripheral circuits.

14. The data holding circuit of claim 13, wherein the supply potential applied to said data holding unit during the read period is higher than the supply potential applied to said peripheral circuits.

15. The data holding circuit of claim 13, wherein the supply potential applied to said data holding unit during the write period is lower than the supply potential applied to said peripheral circuits.

* * * * *